(12) United States Patent
Sachdev et al.

(10) Patent No.: US 11,252,840 B2
(45) Date of Patent: Feb. 15, 2022

(54) VAPOR COOLING OF ELECTRONICS

(71) Applicant: GM GLOBAL TECHNOLOGY OPERATIONS LLC, Detroit, MI (US)

(72) Inventors: Anil K. Sachdev, Rochester Hills, MI (US); Chih-Hung Yen, Bloomfield Hills, MI (US); Venkata Prasad Atluri, Novi, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 198 days.

(21) Appl. No.: 16/575,348

(22) Filed: Sep. 18, 2019

(65) Prior Publication Data

US 2021/0084790 A1 Mar. 18, 2021

(51) Int. Cl.
*H05K 7/20* (2006.01)
*H05K 5/03* (2006.01)

(52) U.S. Cl.
CPC .............. *H05K 7/203* (2013.01); *H05K 5/03* (2013.01); *H05K 7/20172* (2013.01); *H05K 7/20327* (2013.01); *H05K 7/20381* (2013.01)

(58) Field of Classification Search
CPC .............. H05K 7/203; H05K 7/20809; H05K 7/20236; H05K 7/20818; H05K 7/20772; H05K 7/20272; H05K 7/20309; H05K 7/20381; H05K 7/20781; H05K 7/208; H05K 7/2039; H05K 7/20936; H05K 1/0272; H05K 7/20009; H05K 7/2029; H05K 7/20727; H05K 5/03;

(Continued)

(56) References Cited

U.S. PATENT DOCUMENTS 3,489,207 A 1/1970 Miller
4,704,658 A 11/1987 Yokouchi et al.
(Continued)

FOREIGN PATENT DOCUMENTS

GB 1005539 A 9/1965

OTHER PUBLICATIONS

Coppola, Anthony M. et al., U.S. Appl. No. 15/989,988, filed May 25, 2018 entitled, "Apparatus for Cooling an Electric Motor and Method of Making the Same," 69 pages.
(Continued)

*Primary Examiner* — Michael A Matey
(74) *Attorney, Agent, or Firm* — Harness, Dickey & Pierce, P.L.C.

(57) ABSTRACT

A cooling assembly according to various aspects of the present disclosure includes a housing, an electronic component, a dielectric coolant, and a cover. The housing includes an interior compartment having a basin region in which the electronic component and the coolant are disposed. The coolant undergoes phase change between a liquid state and a gas state. The coolant is in direct contact with the electronic component in the liquid state. The cover component extends transversely through the interior compartment and is coupled to the body. The cover component is disposed in a direction with respect to the basin region. The cover component at least partially defines a port in fluid communication with the basin region. The cover component is configured to permit flow therethrough of the dielectric coolant in the gas state in at least the direction.

20 Claims, 8 Drawing Sheets

(58) Field of Classification Search
CPC ............... H05K 7/20172; H05K 7/20327; H01L 23/10; F28F 13/185; B01D 46/0005
See application file for complete search history.

(56) References Cited

U.S. PATENT DOCUMENTS

| | | | | |
|---|---|---|---|---|
| 5,308,920 | A * | 5/1994 | Itoh | F28D 15/0233 174/15.2 |
| 6,019,167 | A | 2/2000 | Bishop et al. | |
| 7,396,521 | B2 | 7/2008 | Hwang | |
| 8,953,318 | B1 * | 2/2015 | Smith | H01L 23/427 361/700 |
| 10,132,270 | B2 | 11/2018 | Coppola et al. | |
| 10,408,163 | B2 | 9/2019 | Kia et al. | |
| 10,765,033 | B1 * | 9/2020 | Keehn | H05K 7/20236 |
| 2008/0083426 | A1 * | 4/2008 | Sachdev | C23F 1/44 134/2 |
| 2010/0290190 | A1 * | 11/2010 | Chester | H05K 7/20772 361/701 |
| 2011/0049976 | A1 * | 3/2011 | Suzuki | H05K 7/20936 307/9.1 |
| 2013/0091868 | A1 * | 4/2013 | Campbell | H01L 35/30 62/3.2 |
| 2013/0105120 | A1 * | 5/2013 | Campbell | H05K 7/20809 165/104.21 |
| 2013/0105122 | A1 * | 5/2013 | Campbell | F28D 15/0266 165/104.26 |
| 2014/0071626 | A1 * | 3/2014 | Campbell | F28F 3/046 361/700 |
| 2014/0146468 | A1 * | 5/2014 | Campbell | G06F 1/20 361/679.53 |
| 2014/0216686 | A1 * | 8/2014 | Shelnutt | H05K 7/20827 165/67 |
| 2014/0342201 | A1 * | 11/2014 | Andres | H01G 11/18 429/62 |
| 2015/0070846 | A1 * | 3/2015 | Shelnutt | H05K 7/203 361/700 |
| 2015/0109735 | A1 * | 4/2015 | Campbell | H05K 7/20318 361/700 |
| 2016/0073548 | A1 * | 3/2016 | Wei | H05K 7/203 361/700 |
| 2017/0064862 | A1 * | 3/2017 | Miyoshi | H01L 21/67109 |
| 2017/0303434 | A1 * | 10/2017 | Katsumata | H01L 23/44 |
| 2018/0020570 | A1 * | 1/2018 | Fujiwara | H05K 7/20418 |
| 2018/0029316 | A1 | 2/2018 | Coppola et al. | |
| 2018/0042138 | A1 * | 2/2018 | Campbell | H05K 7/203 |
| 2018/0153058 | A1 * | 5/2018 | Hirai | H05K 7/20781 |
| 2018/0246550 | A1 * | 8/2018 | Inaba | G06F 1/206 |
| 2020/0305310 | A1 * | 9/2020 | Alissa | H05K 7/20236 |
| 2020/0315060 | A1 * | 10/2020 | Chen | G06F 1/20 |
| 2020/0323100 | A1 * | 10/2020 | Chiu | H05K 7/2039 |
| 2020/0386479 | A1 * | 12/2020 | Tung | F28F 1/32 |
| 2020/0403283 | A1 * | 12/2020 | Gao | H01M 10/6569 |
| 2021/0098838 | A1 * | 4/2021 | Droulez | B60L 58/26 |

OTHER PUBLICATIONS

Coppola, Anthony M. et al., U.S. Appl. No. 16/108,449, filed Aug. 22, 2018 entitled, "Polymeric and Metal Cylinder Head and Method of Making the Same," 67 pages.
Coppola, Anthony M. et al., U.S. Appl. No. 16/148,634, filed Oct. 1, 2018 entitled, "Assemblies Having Enhanced Heat Transfer Through Vascular Channels and Methods of Manufacturing Assemblies Having Vascular Channels," 67 pages.
Sachdev, Anil K. et al., U.S. Appl. No. 16/294,449, filed Mar. 6, 2019 entitled, "Composite Assemblies for Thermal Cooling of Electronic Components," 50 pages.
Fillration Solutions for Gas & Liquid Microfiltration, Donaldson® Filtration Solutions; Publication Code: GLM007/EN/01/15 [Online: http://www2.donaldson.com/tetratex/en-us/pages/literature-brochures.aspx] [retrieved on Jul. 17, 2019], 2 pages.
Ohnstein T. et al., "Micromachined silicon microvalve," IEEE Proceedings on Micro Electro Mechanical Systems, An Investigation of Micro Structures, Sensors, Actuators, Machines and Robots, Napa Valley, California. Feb. 11-14, 1990; DOI: 10.1109/MEMSYS.1990.110256.

* cited by examiner

VAPOR COOLING OF ELECTRONICS

This section provides background information related to the present disclosure which is not necessarily prior art.

The present disclosure relates to vapor cooling of electronics, and more particularly to cooling assemblies for electronics including dielectric coolants.

Vehicles include various types of power electronics. Power electronics typically generate heat. Power electronics are desirably maintained within predetermined temperature ranges for optimum performance and to maximize component life. One way of maintaining the predetermined temperature range is to implement a cooling system to draw heat away from the electronic components.

SUMMARY

This section provides a general summary of the disclosure, and is not a comprehensive disclosure of its full scope or all of its features.

In various aspects, the present disclosure provides a cooling assembly. The cooling assembly includes a housing, an electronic component, a dielectric coolant, and a cover. The housing includes a body and an interior compartment having a basin region. The electronic component is disposed within the basin region. The dielectric coolant is disposed within the basin region. The dielectric coolant is configured to undergo phase change between a liquid state and a gas state. The dielectric coolant is in direct contact with the electronic component when the dielectric coolant is in the liquid state. The cover component extends transversely through the interior compartment. The cover component is coupled to the body. The cover component is disposed in a direction with respect to the basin region. The cover component at least partially defines a port in fluid communication with the basin region. The cover component is configured to permit flow therethrough of the dielectric coolant in the gas state in at least the direction.

In one aspect, the cover component is substantially impermeable to the dielectric coolant in the liquid state.

In one aspect, at least a portion of a perimeter of the cover component is transversely spaced apart from the body to define the port.

In one aspect, the cover component is configured to direct a flow of the dielectric coolant in the liquid state to the port.

In one aspect, the cooling assembly further includes a plurality of protrusions. The protrusions are in the direction with respect to the cover component. The plurality of protrusions extends (i) from the body into the interior compartment, (ii) from the body to an exterior of the housing, or (iii) into the interior compartment and to the exterior of the housing.

In one aspect, the plurality of protrusions includes a first portion and a second portion. The first portion extends from the body into the interior compartment. The second portion extends from the body to the exterior of the housing.

In one aspect, the cooling assembly further includes a fan. The fan is coupled to an exterior of the housing. The fan is configured to circulate air across the body.

In one aspect, when substantially all of the dielectric coolant is in the liquid state, the electronic component is fully submerged in the dielectric coolant and the cover component is outside of the dielectric coolant.

In one aspect, the port has a dimension of greater than or equal to about 1 mm to less than or equal to about 2 mm.

In one aspect, the cover component includes a plurality of apertures configured to permit flow of the dielectric coolant through the plurality of apertures in the gas state. The plurality of apertures is configured to substantially prevent flow of the dielectric coolant through the plurality of apertures in the liquid state.

In one aspect, the cover component includes a body and a plurality of valves coupled to the body. The valves are configured to shift between an open configuration to permit flow of the dielectric coolant through the body and a closed configuration to prevent flow of dielectric coolant through the body.

In one aspect, the valves are configured to shift from the closed configuration to the open configuration when a pressure of the dielectric coolant in the liquid state exceeds a predetermined threshold.

In one aspect, the cooling assembly further includes a pressure sensor disposed within the basin region and a controller. The pressure sensor is configured to detect a pressure. The controller is configured to apply a voltage to shift the plurality of valves from the closed configuration to the open configuration when a detected pressure exceeds a predetermined pressure threshold.

In one aspect, the cooling assembly further includes an accumulator fluidly connected to the interior compartment. The accumulator is configured to contain a portion of the dielectric coolant in the liquid state.

In one aspect, the cooling assembly further includes a baffle disposed in the interior compartment. The baffle at least partially defines a sub-compartment in which the electronic component is disposed within the basin region.

In one aspect, the dielectric coolant has a boiling point of greater than or equal to about −40° C. to less than or equal to about 200° C.

In various aspects, the present disclosure provides a cooling assembly. The cooling assembly includes a housing, a baffle, an electronic component, and a dielectric coolant. The housing includes a body and an interior compartment. The interior compartment has a basin region. The baffle is disposed in the interior compartment. The baffle at least partially defines a sub-compartment. The electronic component is disposed at least partially within the sub-compartment of the basin region. The dielectric coolant is disposed within the basin region. The dielectric coolant is configured to undergo phase change between a liquid state and a gas state. The dielectric coolant is in direct contact with the electronic component when the dielectric coolant is in the liquid state.

In one aspect, the cooling assembly further includes a cover component extending transversely though the interior compartment. The cover component is coupled to the baffle. The cover component is disposed in a direction with respect to the basin region. The cover component at least partially defines a port in fluid communication with the basin region. The cover component is configured to permit flow therethrough of the dielectric coolant in the gas state in at least the direction.

In one aspect, in the liquid state, substantially all of the dielectric coolant is disposed within the sub-compartment.

In various aspects, the present disclosure provides a cooling assembly. The cooling assembly includes a housing, an electronic component, a dielectric coolant, and an accumulator. The housing includes a body and an interior compartment. The interior compartment has a basin region. The electronic component is disposed within the basin region. The dielectric coolant is disposed within the basin region. The dielectric coolant is configured to undergo phase change between a liquid state and a gas state. The dielectric coolant is in direct contact with the electronic component when the dielectric coolant is in the liquid state. The accumulator is fluidly connected to the basin region. The accumulator is configured to contain a portion of the dielectric coolant in the liquid state.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIGS. 1A-1B relate to a cooling assembly according to various aspects of the present disclosure, the cooling assembly including a cover component; FIG. 1A is a sectional view of the cooling assembly; and FIG. 1B is a partial perspective view of the cooling assembly taken at line 1B-1B of FIG. 1A;

Figure 8A:
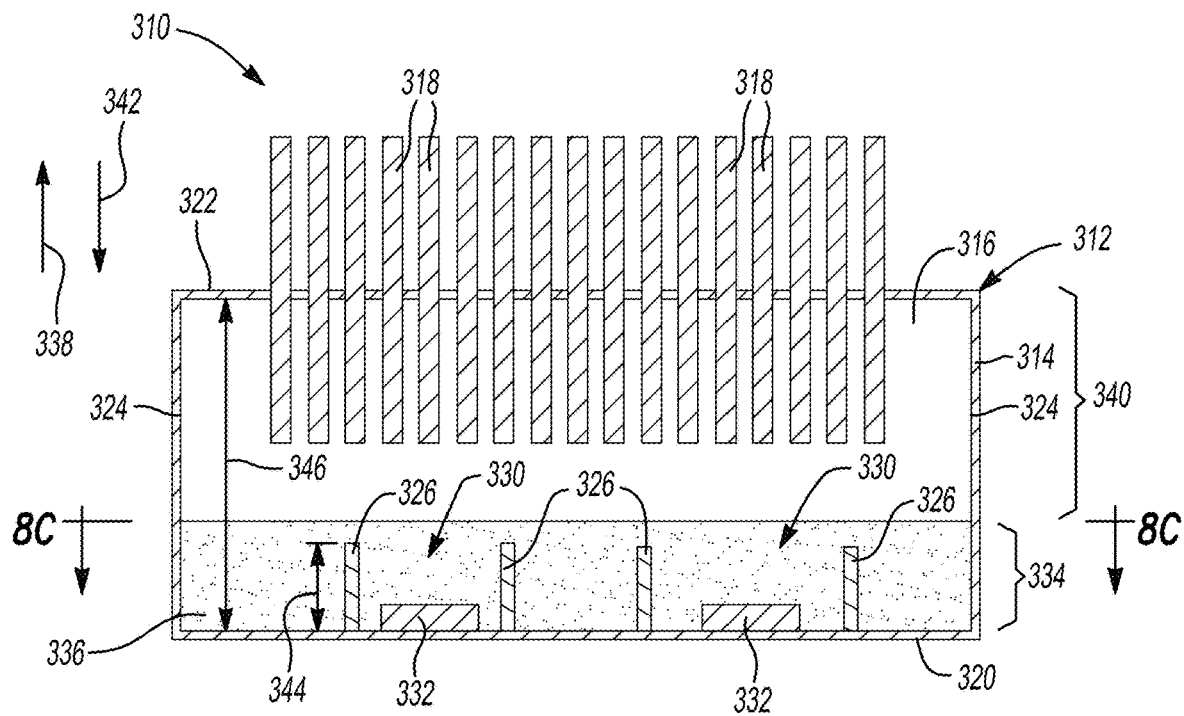
Figure 8B:
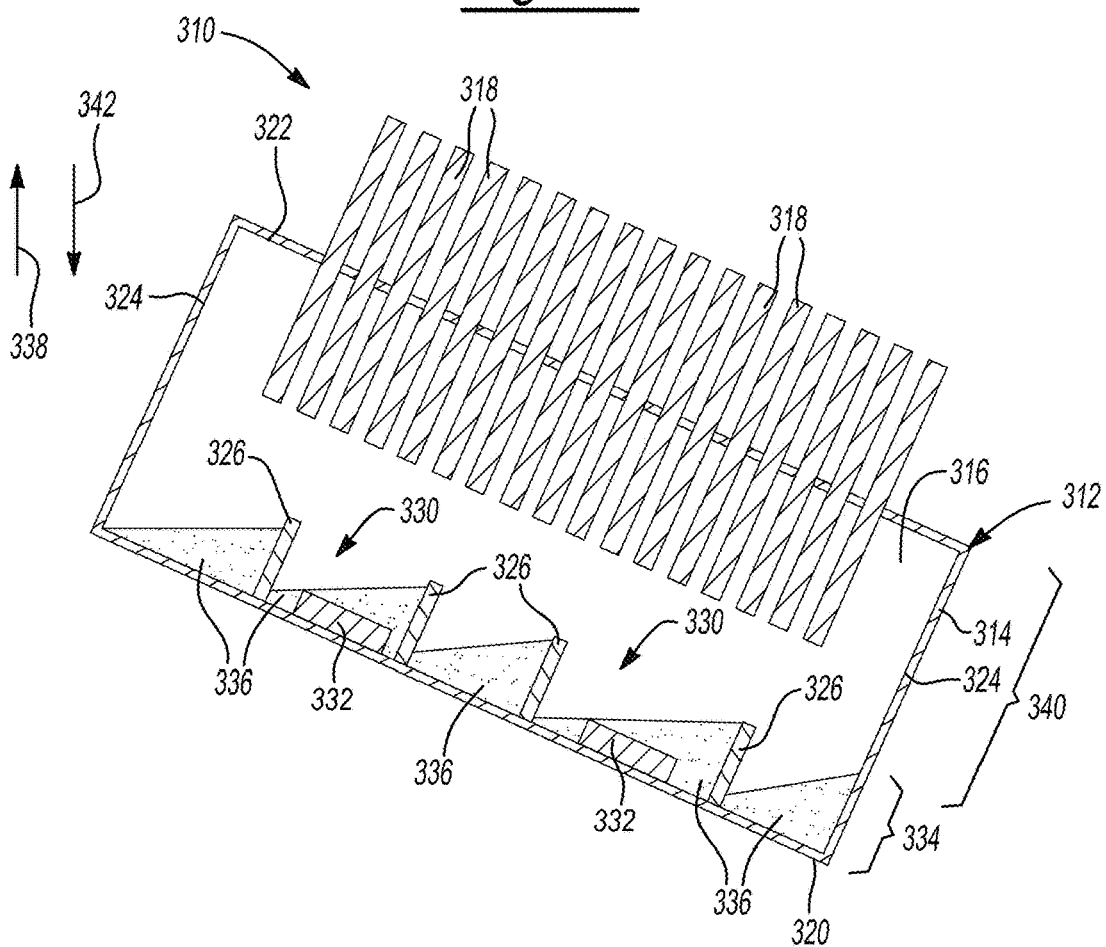
Figure 8C:
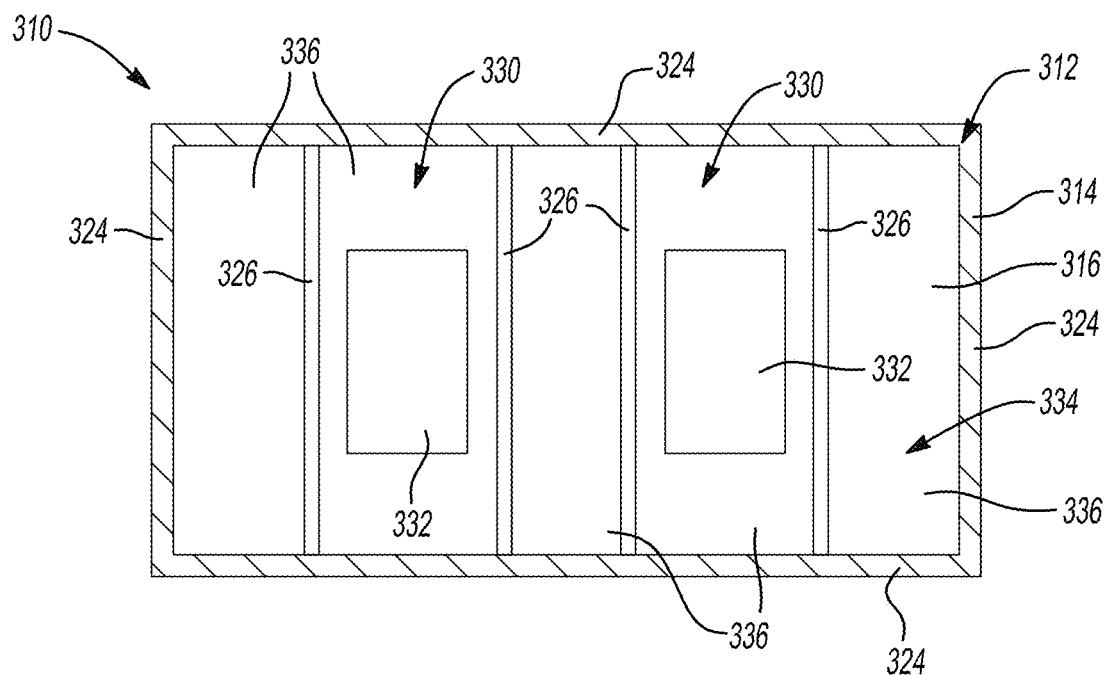
Figure 9:
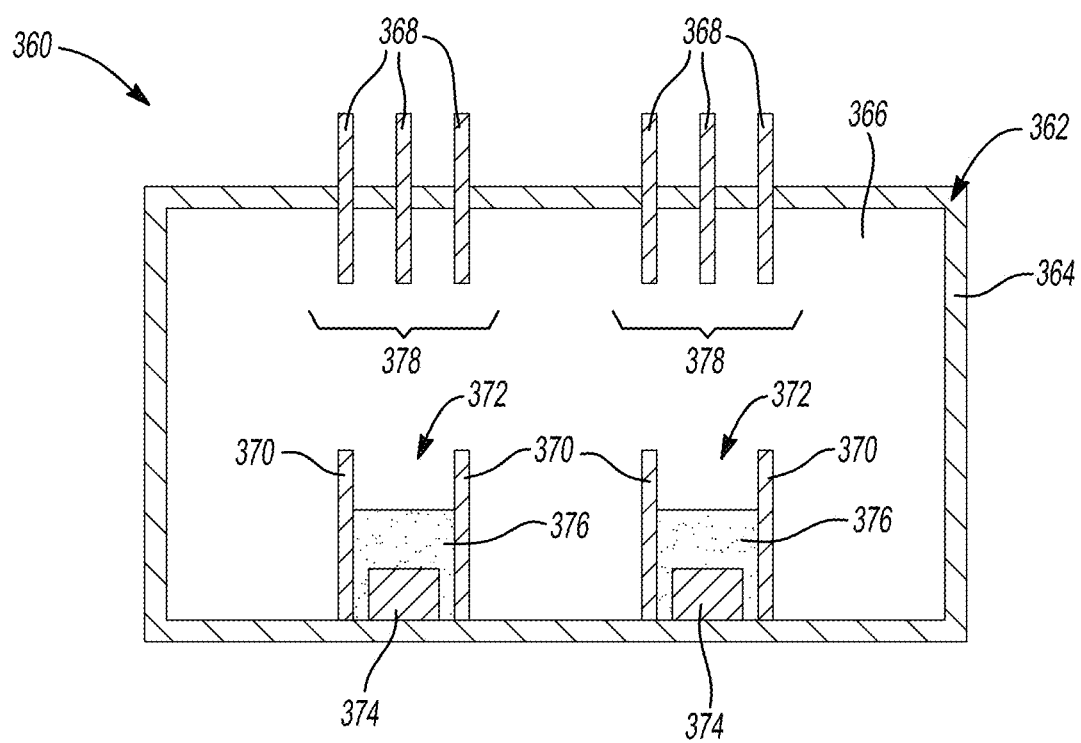
Figure 10:
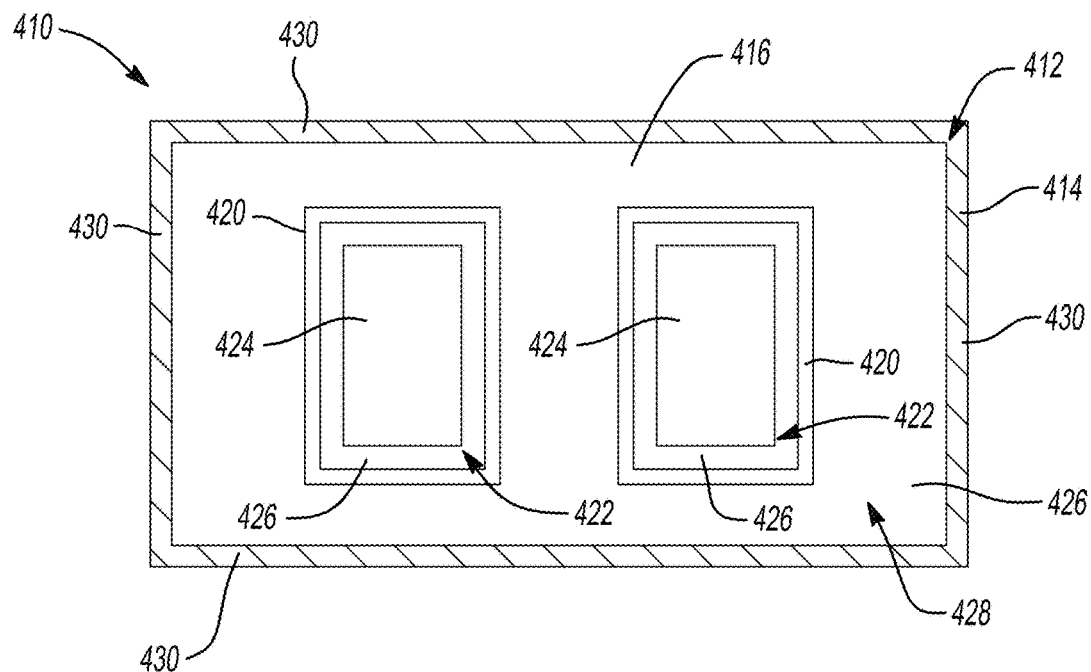
Figure 11:
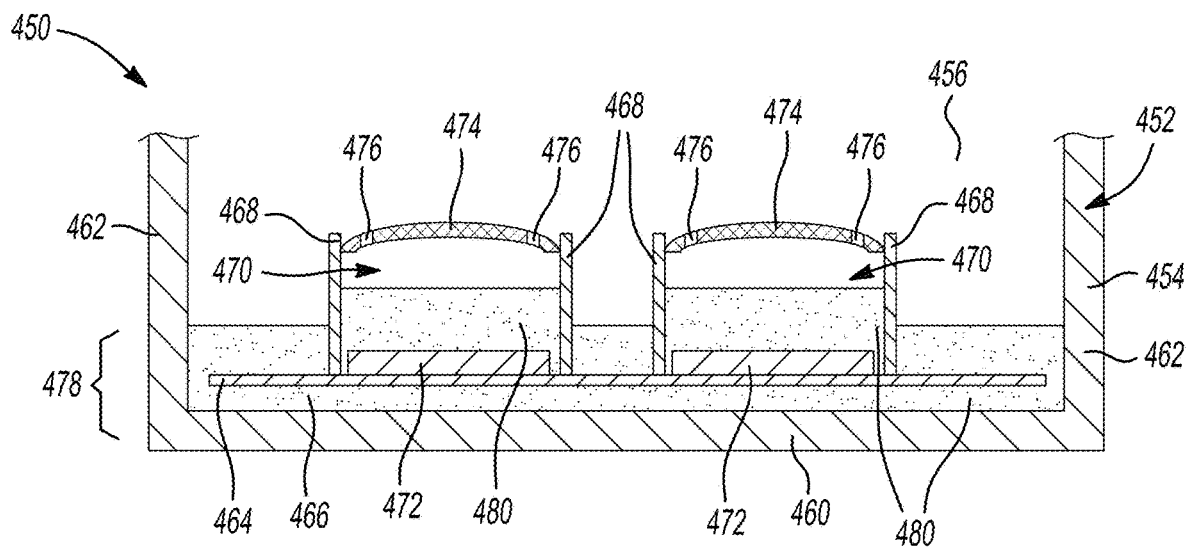
Figure 12:
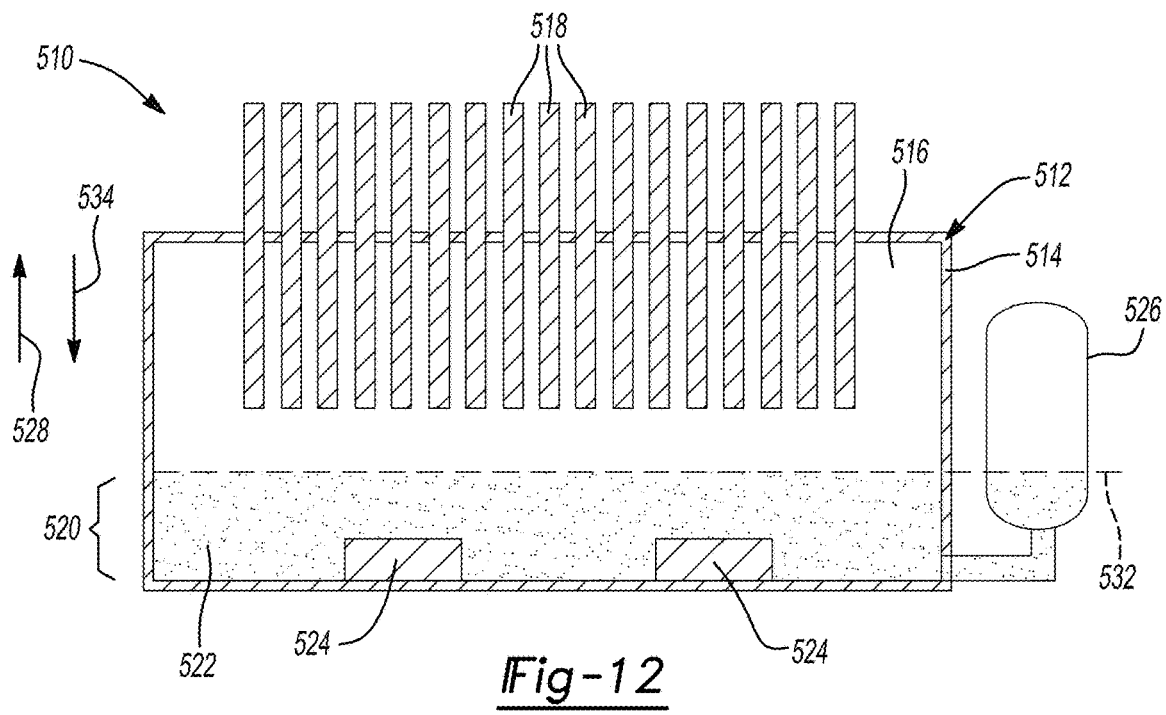
Figure 13:
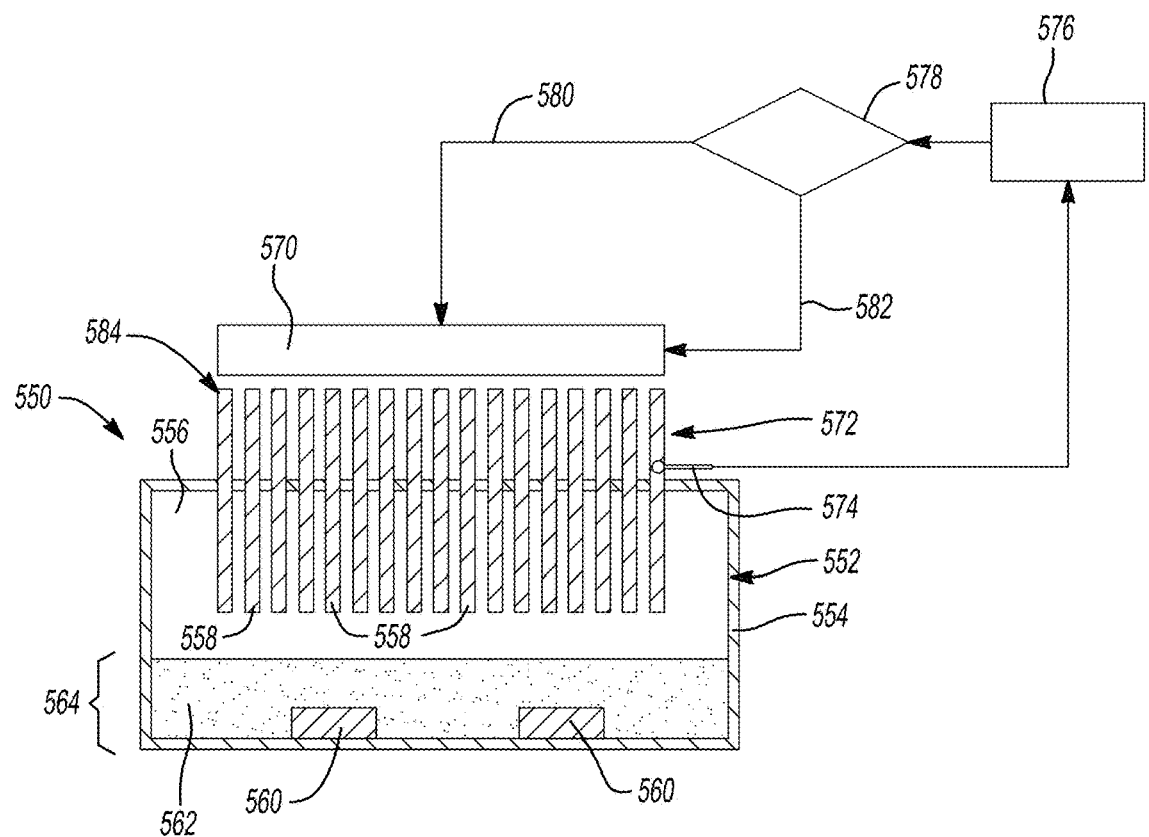

FIGS. 8A-8C are sectional views of a cooling assembly according to various aspects of the present disclosure, the cooling assembly including sub-compartments; FIG. 8A depicts the cooling assembly in a level position; FIG. 8B depicts the cooling assembly in an angled position; and FIG. 8C depicts another sectional view of the cooling assembly taken at line 8C-8C of FIG. 8A;

FIG. 9 is a sectional view of another cooling assembly including sub-compartments according to various aspects of the present disclosure;

FIG. 10 is a sectional view of yet another cooling assembly including sub-compartments according to various aspects of the present disclosure;

FIG. 11 is a sectional view of yet another cooling assembly according to various aspects of the present disclosure, the cooling assembly including sub-compartments having cover components;

FIG. 12 is a sectional view of a cooling assembly according to various aspects of the present disclosure, the cooling assembly including an accumulator; and FIG. 13 is a schematic view of a cooling assembly according to various aspects of the present disclosure, the cooling assembly including a fan.

Corresponding reference numerals indicate corresponding parts throughout the several views of the drawings.

DETAILED DESCRIPTION

Example embodiments are provided so that this disclosure will be thorough, and will fully convey the scope to those who are skilled in the art. Numerous specific details are set forth such as examples of specific compositions, components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, elements, compositions, steps, integers, operations, and/or components, but do not preclude the presence or addition of one or more other features, integers, steps, operations, elements, components, and/or groups thereof. Although the open-ended term "comprising," is to be understood as a non-restrictive term used to describe and claim various embodiments set forth herein, in certain aspects, the term may alternatively be understood to instead be a more limiting and restrictive term, such as "consisting of" or "consisting essentially of." Thus, for any given embodiment reciting compositions, materials, components, elements, features, integers, operations, and/or process steps, the present disclosure also specifically includes embodiments consisting of, or consisting essentially of, such recited compositions, materials, components, elements, features, integers, operations, and/or process steps. In the case of "consisting of," the alternative embodiment excludes any additional compositions, materials, components, elements, features, integers, operations, and/or process steps, while in the case of "consisting essentially of," any additional compositions, materials, components, elements, features, integers, operations, and/or process steps that materially affect the basic and novel characteristics are excluded from such an embodiment, but any compositions, materials, components, elements, features, integers, operations, and/or process steps that do not materially affect the basic and novel characteristics can be included in the embodiment.

Any method steps, processes, and operations described herein are not to be construed as necessarily requiring their performance in the particular order discussed or illustrated, unless specifically identified as an order of performance. It is also to be understood that additional or alternative steps may be employed, unless otherwise indicated.

When a component, element, or layer is referred to as being "on," "engaged to," "connected to," or "coupled to" another element or layer, it may be directly on, engaged, connected or coupled to the other component, element, or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various steps, elements, components, regions, layers and/or sections, these steps, elements, components, regions, layers and/or sections should not be limited by these terms, unless otherwise indicated. These terms may be only used to distinguish one step, element, component, region, layer or section from another step, element, component, region, layer or section. Terms such as "first," "second," and other numerical terms when used herein do not imply a sequence or order unless clearly indicated by the context. Thus, a first step, element, component, region, layer or section discussed below could be termed a second step, element, component, region, layer or section without departing from the teachings of the example embodiments.

Spatially or temporally relative terms, such as "before," "after," "inner," "outer," "beneath," "below," "lower," "above," "upper," and the like, may be used herein for ease of description to describe one element or feature's relationship to another element(s) or feature(s) as illustrated in the figures. Spatially or temporally relative terms may be intended to encompass different orientations of the device or system in use or operation in addition to the orientation depicted in the figures.

Throughout this disclosure, the numerical values represent approximate measures or limits to ranges to encompass minor deviations from the given values and embodiments having about the value mentioned as well as those having exactly the value mentioned. Other than in the working examples provided at the end of the detailed description, all numerical values of parameters (e.g., of quantities or conditions) in this specification, including the appended claims, are to be understood as being modified in all instances by the term "about" whether or not "about" actually appears before the numerical value. "About" indicates that the stated numerical value allows some slight imprecision (with some approach to exactness in the value; approximately or reasonably close to the value; nearly). If the imprecision provided by "about" is not otherwise understood in the art with this ordinary meaning, then "about" as used herein indicates at least variations that may arise from ordinary methods of measuring and using such parameters. For example, "about" may comprise a variation of less than or equal to 5%, optionally less than or equal to 4%, optionally less than or equal to 3%, optionally less than or equal to 2%, optionally less than or equal to 1%, optionally less than or equal to 0.5%, and in certain aspects, optionally less than or equal to 0.1%.

In addition, disclosure of ranges includes disclosure of all values and further divided ranges within the entire range, including endpoints and sub-ranges given for the ranges.

Example embodiments will now be described more fully with reference to the accompanying drawings.

Some cooling assemblies include dielectric liquids, also referred to as dielectric coolants, in thermal communication with electronic components. Heat generated during operating of the electronic components is transferred to the dielectric coolant, which changes state upon reaching its boiling point. The gas-state dielectric coolant condenses upon contact with a cooler portion of the cooling assembly, such as a housing, pins, or fins. The condensed dielectric liquid can be returned to a location near the electronic component to repeat the heat transfer and phase change cycle to move heat away from the electronic component.

The use of dielectric coolants may be challenging when the cooling assembly is not stationary. For example, vehicle electronics often include cooling assemblies that are subject to motion, including bumps and inclines. Vehicle motion may force the liquid dielectric coolant out of contact with the electronic component and may lead to heating the electronic component above a preferred temperature. It may also prematurely (i.e., in its liquid state) contacts the cooler portions of the cooling assembly onto which the vaporized coolant is to condense (e.g., housing, pins, fins). Premature contact of the liquid-state dielectric coolant with the cooler portions of the housing may heat the housing, pins, and/or fins, thereby reducing the effectiveness of subsequent condensation of gas-state dielectric coolant.

A cooling assembly for an electronic component according to various aspects of the present disclosure may generally include a liquid-state dielectric coolant disposed in a basin region of a housing. The electronic component may be disposed within the basin region and at least partially submerged in the liquid-state dielectric coolant. In certain aspects, the cooling assemblies may also include heat-transfer features coupled to the housing, such as pins and/or fins, onto which gas-state dielectric coolant may condense. The cooling assembly may include one or more features to retain the liquid-state dielectric coolant in the basin region and prevent dry-out of the basin region. As will be described in greater detail below, such features may include one or more of a cover component extending across at least a portion of the basin region (FIGS. 1A-7, 11), one or more baffles defining a sub-compartment in the basin region (FIGS. 8A-11), an accumulator in fluid communication with the basin region (FIG. 12), and/or a fan configured to cool the heat transfer features (FIG. 13). Features described in the assemblies below may be used alone or in combination. Cooling assemblies according to various aspects of the present disclosure may reduce or prevent overheating of electronic components, thereby facilitating increased CPU utilization, decreased processor damage, and a reduction in reboots and other failure modes.

Figure 1A:
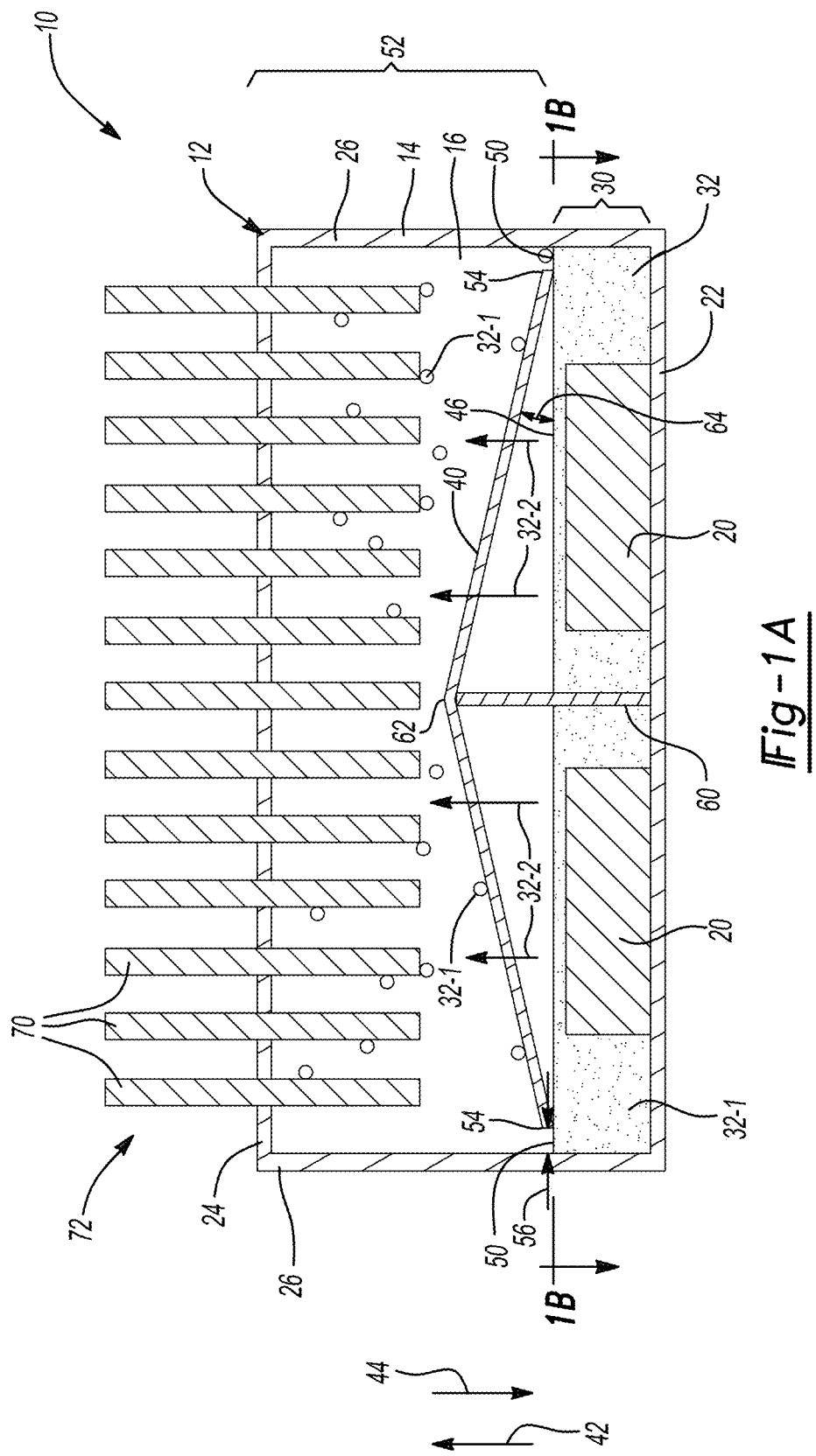
Figure 1B:
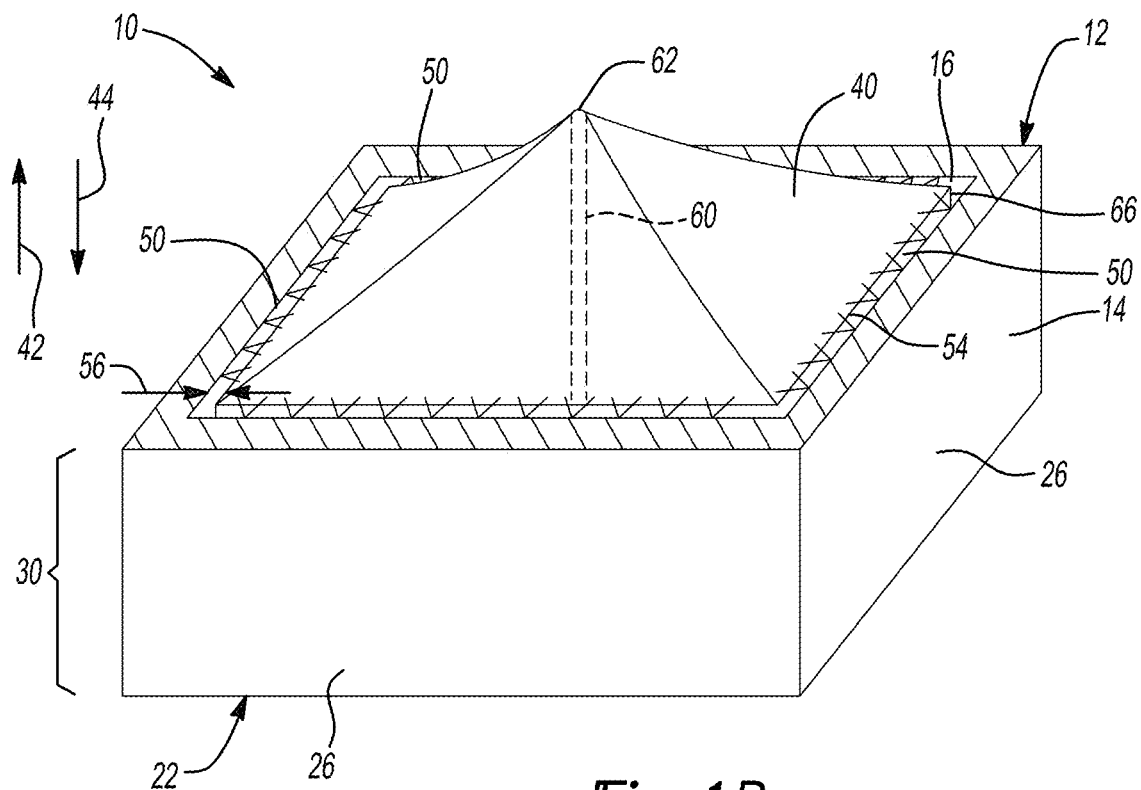

In various aspects, the present disclosure provides a cooling assembly including a cover component extending transversely over an electronic component that is at least partially submerged in a liquid-state dielectric coolant. With reference to FIGS. 1A-1B, a cooling assembly 10 according to various aspects of the present disclosure is provided. The cooling assembly 10 includes a housing 12. The housing 12 includes a body 14 and an interior compartment 16. One or more electronic components 20 (FIG. 1A) may be disposed within the interior compartment 16. The electronic components 20 may include power inverters, DC-DC converters, auxiliary power modules, and high- and low-voltage battery pack modules, by way of non-limiting example.

The body 14 of the housing 12 may generally include a floor 22, a ceiling 24 (FIG. 1A), and one or more side walls 26. In certain aspects, the body 14 may have a substantially rectangular cross section. However, in various other aspects, the body 14 may have other shapes, such as a circular cross section or a trapezoidal cross section.

The interior compartment 16 includes a basin region 30. In certain aspects, the basin region 30 may be at least partially defined by the floor 22 and portions of the side walls 26. However, in various other aspects, a basin region 30 may be defined by different or additional walls (see, e.g., baffles 326 of FIGS. 8A-8C). The electronic components 20 are at least partially disposed within the basin region 30. In certain aspects, the electronic components 20 may be fully disposed within the basin region 30.

The cooling assembly 10 further includes a dielectric fluid or coolant 32 (FIG. 1A) disposed in the basin region 30. In certain aspects, the dielectric coolant 32 may have a boiling point of greater than or equal to about −40° C. to less than or equal to about 200° C., optionally greater than or equal to about 10° C. to less than or equal to about 180° C., or optionally greater than or equal to about 60° C. to less than or equal to about 85° C., by way of example. The dielectric coolant 32 is configured to undergo phase change between a liquid state 32-1 and a gas state 32-2. The liquid-state dielectric coolant 32-1 is in thermal communication with the electronic components 20. In certain aspects, the liquid-state dielectric coolant 32-1 may be in direct contact with the electronic components 20. In certain aspects, the dielectric coolant 32 may include hydrocarbons, perfluorocarbons, or combinations thereof, by way of example.

The cooling assembly 10 further includes a cover component 40. In various aspects, the cover component 40 may be referred to as a "film" or a "breathable fabric." The cover component 40 may extend transversely through the interior compartment 16 (e.g., substantially perpendicular to a height of the interior compartment). The cover component 40 may extend across or over the basin region 30. The cover component 40 is disposed in a first or upward direction 42 with respect to the electronic components 20.

The cover component 40 is permeable to the gas-state dielectric coolant 32-2 in at least the upward direction 42. Accordingly, when the liquid-state dielectric coolant 32-1 is heated by operation of the electronic components 20, the gas-state dielectric coolant 32-2 that is generated diffuses in substantially the upward direction 42, through the cover component 40, and toward the ceiling 24. In certain aspects, the cover component 40 may be substantially impermeable to the gas-state dielectric coolant 32-2 in a second or downward direction 44 so that the gas-state dielectric coolant 32-2 does not diffuse back into the basin region 30.

The cover component 40 may be substantially impermeable to the liquid-state dielectric coolant 32-1. Accordingly, the cover component 40 may hold the liquid-state dielectric coolant 32-1 against the electronic components 20, even during motion of the cooling assembly 10. The electronic components 20 are therefore at least partially submerged in the liquid-state dielectric coolant 32-1. In certain aspects, the electronic components 20 may be fully submerged in the liquid-state dielectric coolant 32-1.

The cover component 40 may extend transversely across a large portion of a surface 46 (FIG. 1A) of the liquid-state dielectric coolant 32-1 in the basin region 30 to minimize displacement of the liquid-state dielectric coolant 32-1 from the basin region 30. For example, the cover component 40 may cover greater than or equal to about 75% of the surface 46, optionally greater than or equal to about 90% of the surface 46, optionally greater than or equal to about 95% of the surface 46, optionally greater than or equal to about 96% of the surface 46, optionally greater than or equal to about 97% of the surface 46, optionally greater than or equal to about 98% of the surface 46, or optionally greater than or equal to about 99% of the surface 46.

The cover component 40 may cover less than 100% of the surface 46 so that liquid-state dielectric coolant 32-1 can be returned to the basin region 30 upon condensing. Thus, the cover component 40 may at least partially define one or more ports 50 that fluidly connects the basin region 30 with an upper region 52 (FIG. 1A) of the interior compartment 16. After gas-state dielectric coolant 32-2 condenses, droplets of liquid-state dielectric coolant 32-1, fall onto the cover component 40, and travel through the port 50 back into the basin region 30. In certain aspects, the port 50 may be a substantially continuous gap around a periphery 54 of the cover component 40, as shown in FIG. 1B. The gap may be defined between the side walls 26 and the periphery 54 of the cover component 40. In various other aspects, a cooling assembly may include a plurality of discrete ports defined between a cover component and a side wall (see e.g., ports 178 of FIG. 4). In various other aspects, a cooling assembly may additionally or alternatively include a plurality of discrete ports defined in a cover component, such as apertures (see, e.g., ports 476 of FIG. 11).

In certain aspects, the port 50, such as the gap, may have a maximum dimension 56 of less than or equal to about 3 mm, optionally less than or equal to about 2 mm, or optionally less than or equal to about 1 mm. In certain aspects, the maximum dimension 56 may be greater than or equal to about 1 mm to less than or equal to about 2 mm. However, a size of the port 50 may be dependent upon a composition of the coolant 32 and different maximum dimensions 56 may be used within the scope of the present disclosure. In certain aspects, the dimension 56 may be small enough to prevent flow of liquid-state dielectric coolant 32-1 in the upward direction 42 due to surface tension of the liquid-state dielectric coolant 32-1.

The cover component 40 may be shaped to guide droplets of liquid-state dielectric coolant 32-1 to the port 50. Accordingly, at least a portion of the cover component 40 may have a slope or curvature in the downward direction 44 toward the port 50. For example, the cover component 40 may be supported by a post 60. The post 60 may define a peak 62 of the cover component 40. The cover component 40 may define a slope between the peak 62 and the periphery 54 to guide condensed liquid-state dielectric coolant 32-1 toward the port 50. In various aspects, the slope may define an incline angle 64 (FIG. 1A) of greater than or equal to about 15° to less than or equal to about 75°, optionally greater than or equal to about 30° to less than or equal to about 60°, or greater than or equal to about 40° to less than or equal to about 50°.

The cover component 40 is coupled to the body 14. For example, the cover component 40 may be coupled to the side wall 26 by one or more fasteners or a plurality of stitches 66 (FIG. 1B). The stitches 66 may be formed from thread, elastic, or wire, by way of example. In various other aspects, a cover component is stiff enough to maintain a slope or curvature without a post. In various aspects, a cover component may be coupled to a floor (e.g., by one or more posts) without also being coupled to side walls. In various other aspects, a cover component may be suspended from a ceiling. In various other aspects, a cover component may be coupled to a side wall without being separately coupled to a ceiling or a floor.

The cooling assembly 10 may further include a plurality of protrusions 70 (FIG. 1A). The protrusions 70 may be disposed in the upward direction 42 with respect to the cover component 40. The protrusions 70 may extend from the body 14 into the interior compartment 16, from the body 14 to an exterior 72 (FIG. 1A) of the housing 12, or both into the interior compartment 16 and to the exterior 72 of the housing 12, as shown in FIG. 1A. The protrusions 70 may be any shape that provides an increased surface area for heat transfer. For example, the protrusions 70 may be pins or fins.

The protrusions 70 may be coupled to the body 14, such as being directly coupled to the ceiling 24. The protrusions may be distributed across at least a portion of the body 14. For example, the protrusions 70 may be distributed across substantially the entire ceiling 24. In various other aspects, protrusions may be coupled other portions of the body. In various aspects, protrusions may be disposed in discrete regions of the body, such as over or near an electronic component (see, e.g., protrusions 368 in discrete regions 378 of FIG. 9).

The protrusions 70 may facilitate heat transfer from the gas-state dielectric coolant 32-2 to the exterior 72. Thus, the protrusions 70 may be formed from a thermally-conductive material. In various aspects, the thermally-conductive material may have a thermal conductivity of greater than or equal to about 150 W/m·K, optionally greater than or equal to about 175 W/m·K, optionally greater than or equal to about 200 W/m·K, optionally greater than or equal to about 250 W/m·K, optionally greater than or equal to about 300 W/m·K, optionally greater than or equal to about 350 W/m·K, optionally greater than or equal to about 375 W/m·K, or optionally greater than or equal to about 400 W/m·K. In certain aspects, the thermal conductivity may be greater than or equal to about 150 W/m·K to less than or equal to about 410 W/m·K. In certain aspects the thermally-conductive material may include copper, aluminum, silver, alloys thereof, or combinations thereof, by way of example.

The housing 12 may be formed from a metallic material. For example, the housing may be formed from aluminum, copper, silver, alloys thereof, or combinations thereof. In certain aspects, the housing 12 may have a wall thickness of greater than or equal to about 0.5 mm to less than or equal to about 15 mm, optionally greater than or equal to about 0.5 mm to less than or equal to about 5 mm, or greater than or equal to about 0.5 mm to less than or equal to about 3 mm.

Figure 2:
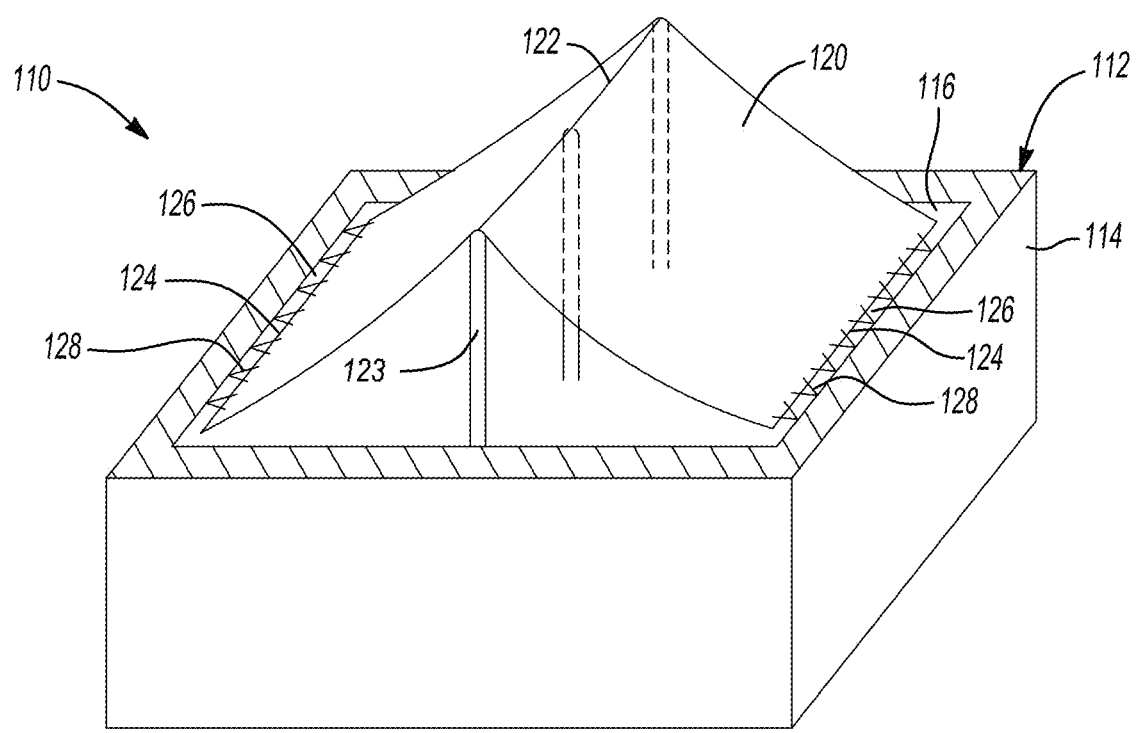
FIG. 2 is a partial perspective view of another cooling assembly having a cover component according to various aspects of the present disclosure.

Cover components may have other shapes that facilitate returning condensed liquid-state dielectric coolant to a basin region. With reference to FIG. 2, another cooling assembly 110 according to various aspects of the present disclosure is provided. The cooling assembly 110 generally includes a housing 112 having a body 114 and an interior compartment 116. Unless otherwise described, the cooling assembly 110 may be similar to the cooling assembly 10 of FIGS. 1A-1B.

The cooling assembly 110 includes a cover component 120 that extends transversely across the interior compartment 116. The cover component 120 may include an elongated peak 122 that is supported by a plurality of posts 123. The cover component 120 is sloped between the elongated peak 122 and opposing peripheral edges 124. The edges 124 are spaced apart from the body 114 to define a port or gap 126. The edges 124 may be coupled to the body 114 via a plurality of stitches 128.

Figure 3:
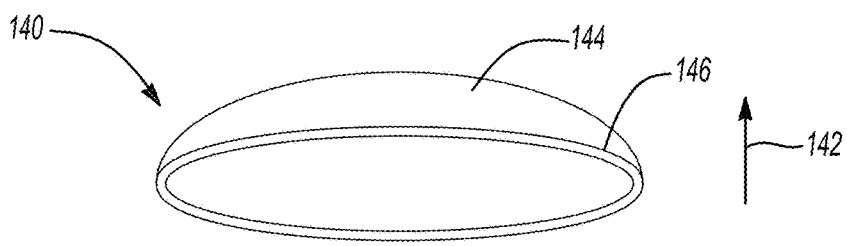
FIG. 3 is a perspective view of a cover component for yet another cooling assembly according to various aspects of the present disclosure.

Referring to FIG. 3, yet another cover component 140 for a cooling assembly according to various aspects of the present disclosure is provided. The cover component 140 may be curved rather than sloped. When the cover component 140 is disposed in the cooling assembly, the cover component 140 may be convex with respect to an electrical component. The cover component 140 may be configured to permit the flow of a gas-state dielectric coolant in a first or upward direction 142 therethrough. A surface 144 of the cover component 140 may be configured to guide the flow of liquid-state dielectric coolant toward a periphery 146. Except for shape, the cover component 140 may be similar to the cover component 40 of the cooling assembly 10 of FIGS. 1A-1B.

Figure 4:
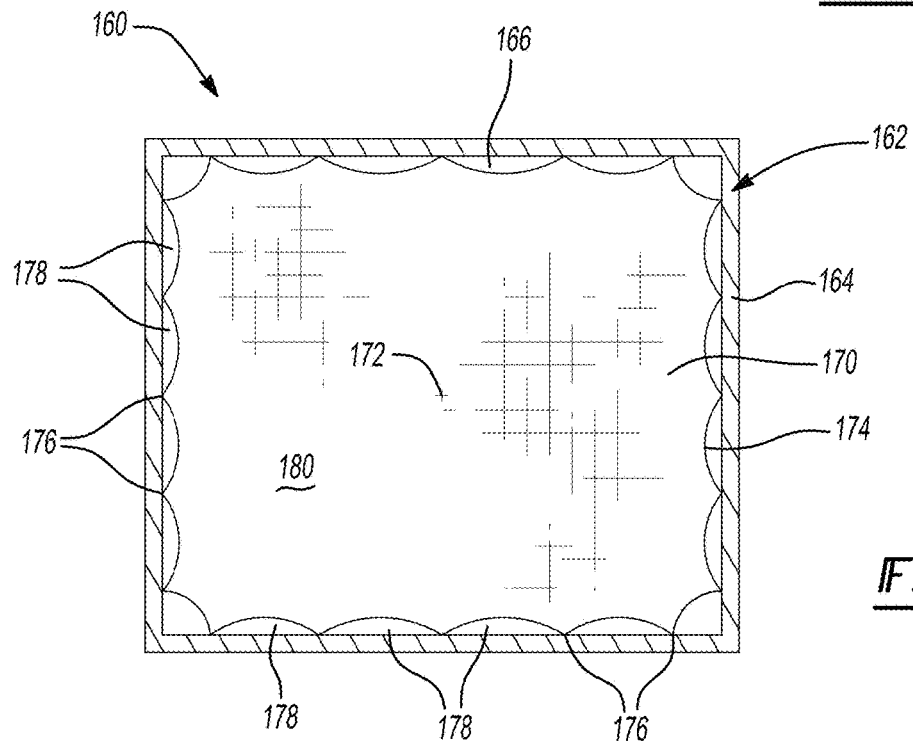
FIG. 4 is a sectional view of yet another cooling assembly having a cover component according to various aspects of the present disclosure.

Ports for returning condensed liquid-state coolant to a basin region may have other shapes or locations. With reference to FIG. 4, yet another cooling assembly 160 according to various aspects of the present disclosure is provided. The cooling assembly 160 may generally include a housing 162 having a body 164 and an interior compartment 166. Unless otherwise described, the cooling assembly 160 may be similar to the cooling assembly 10 of FIGS. 1A-1B.

The cooling assembly 160 includes a cover component 170 extending transversely across the interior compartment 166. The cover component 170 includes a peak 172 and slopes toward a periphery 174. The cover component 170 is coupled to the body 164 at a plurality of discrete connection locations 176. Discrete ports 178 are disposed between the connection locations 176. The cover component 170 is configured to guide liquid-state dielectric coolant along a surface 180 toward the periphery 174 and through the discrete ports 178.

A cover component according to various aspects of the present disclosure may be made of any material, combination of materials, or combination of components that is configured to allow the passage of gas-state dielectric coolant in at least an upward direction and prevent or reduce the passage of liquid-state dielectric coolant in at least the upward direction. In certain variations, the cover component is permeable to gas-state dielectric coolant in both the upward direction and a downward direction and impermeable to liquid-state dielectric coolant in both the upward and downward directions. The cover component may be formed from a microporous membrane (see, e.g., FIG. 5), a material including a plurality of passively-actuated valves (see, e.g., FIG. 6), a sheet assembly including one or more actively-actuated valves (see, e.g., FIG. 7), or a breathable fabric (e.g., certain GORE-TEX brand fabrics; COLUMBIA brand OMNI-TECH fabrics; and eVENT brand fabrics), by way of example.

Figure 5:
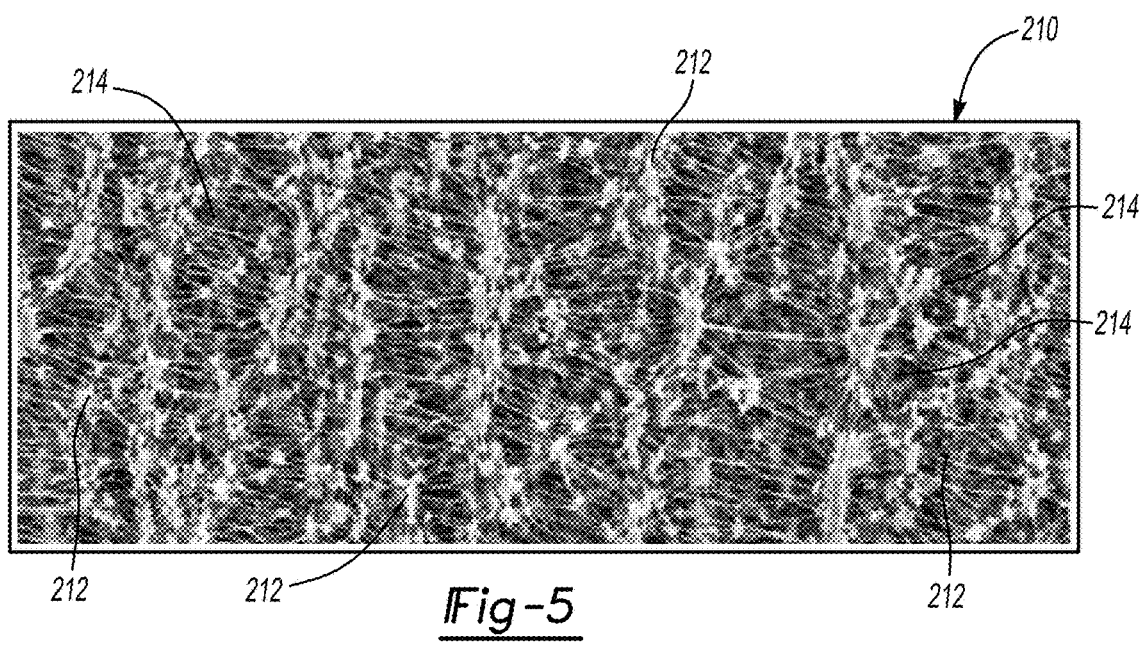
FIG. 5 is a scanning electron microscope image of a microporous membrane for a portion of a cover component according to various aspects of the present disclosure.

With reference to FIG. 5, an example of a microporous membrane 210 for a cover component according to various aspects of the present disclosure is provided. The microporous membrane 210 may be formed from fibers 212 and include a plurality of apertures or pores 214. The fibers 212 may be woven or nonwoven.

In certain aspects, the fibers 212 are hydrophobic and may therefore substantially prevent the flow therethrough of a water-based dielectric coolant. In certain aspects, the fibers 212 may be treated to be oleophobic to prevent the flow therethrough of certain types of nonpolar dielectric coolants. In certain aspects, the pores may be sized to reduce or prevent the flow of dielectric coolant therethrough due to the surface tension of the dielectric coolant. The microporous membrane 210 may facilitate pressure equalization between a basin region and an upper region of an interior compartment of a cooling assembly (see, e.g., basin region 30 and upper region 52 of the cooling assembly 10 of FIG. 1A) due to its permeability to gas-state dielectric coolant. One example of a microporous membrane is the TETRATEX® ePTFE membrane by DONALDSON FILTRATION SOLUTIONS.

Figure 6:
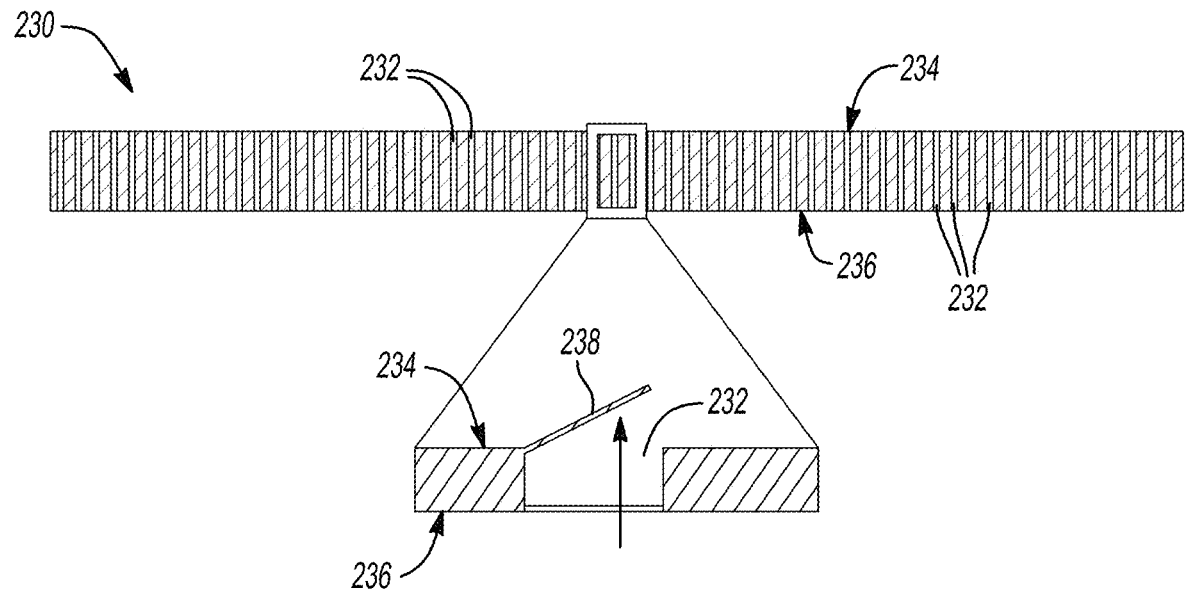
FIG. 6 is a sectional view of a breathable fabric for a cover component according to various aspects of the present disclosure.

Referring to FIG. 6, an example of a breathable fabric 230 for a cover component according to various aspects of the present disclosure is provided. The fabric 230 may include a plurality of apertures 232 extending between a first side 234 and a second side 236. The first side 234 may be configured to be disposed toward an upper region of an interior compartment of a cooling assembly (see, e.g., upper region 52 of FIG. 1A). The second side 236 may be configured to be disposed toward a basin region of an interior compartment of a cooling assembly (see, e.g., basin region 30 of FIG. 1A). The fabric 230 may further include a plurality of valves, such as flaps 238. Each flap 238 may be associated with a respective aperture 232.

The flaps 238 may be movable (e.g., pivotable) between a closed position and an open position. When the flaps 238 are in the closed position, the fabric 230 is impermeable to a dielectric coolant in both a liquid state and a gas state. When the flaps are in the open position, the fabric 230 is permeable to the dielectric coolant in the gas state. In certain aspects, depending on the sizes of the apertures 232, the liquid-state dielectric coolant may be prevented from flowing through the apertures 232 due to surface tension. The flaps 238 may be automatically moved from the closed position to the open position when a pressure in the basin region exceeds a predetermined pressure value. The flaps 238 may be returned to the closed position when the pressure drops below the predetermined value. That is, the flaps 238 may be biased in the closed position.

During operation of the cooling assembly including the cover component made of the breathable fabric 230, an electronic component may generate heat that is transferred to the liquid-state dielectric coolant. The liquid-state dielectric coolant may exceed its boiling point and undergo phase change to form gas-state dielectric coolant. When enough gas-state dielectric coolant is generated, the pressure in the basin region may exceed the predetermined pressure value to move the flaps 238 from the closed position to the open position. When the pressure in the basin region falls below the predetermined pressure value, the flaps 238 may return to the closed position. When the gas-state dielectric coolant condenses to form droplets of liquid-state dielectric coolant, the droplets may fall onto the first side 234 of the fabric 230, flow over the flaps 238 or the apertures 232 (over which the droplets may flow without flowing through due to surface tension), and back into the basin region.

Figure 7:
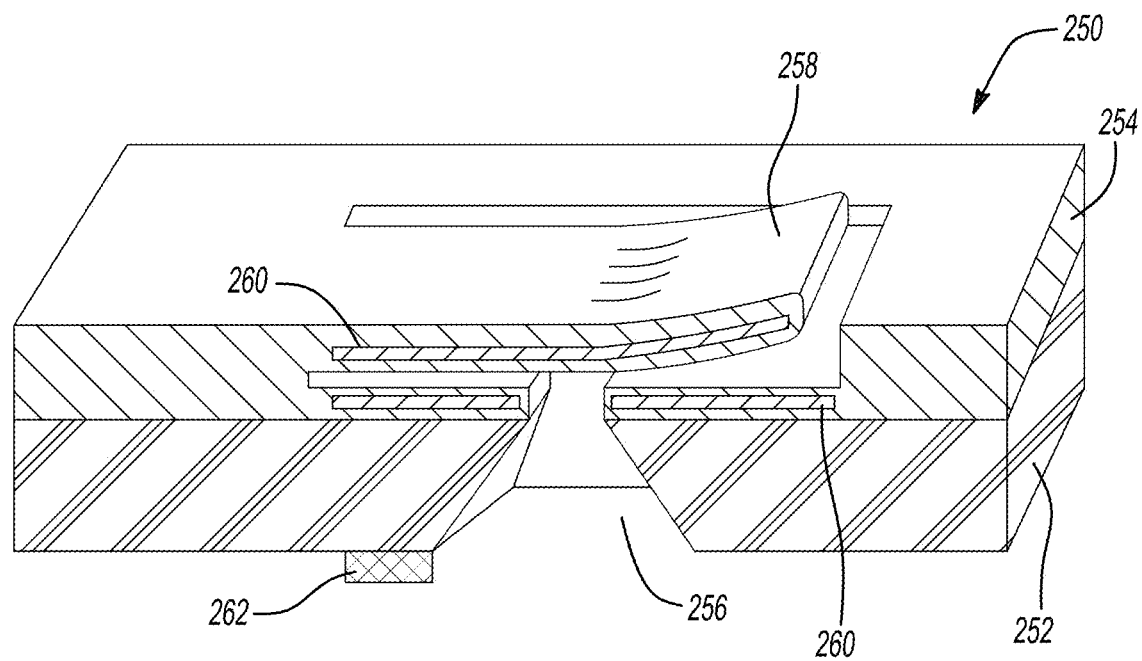
FIG. 7 is a sectional view of a sheet assembly with a valve of a cover component according to various aspects of the present disclosure.

With reference to FIG. 7, a sheet assembly 250 for a cover component according to various aspects of the present disclosure is provided. The sheet assembly 250 may include a base plate 252 and a dielectric plate 254. The base plate 252 may be configured to be disposed toward a basin region (see, e.g., basin region 30 of FIG. 1A). The dielectric plate 254 may be configured to be disposed toward an upper region (see, e.g., upper region 52 of FIG. 1A). The assembly 250 may include one or more apertures 256. Each aperture 256 may be associated with a respective closure plate 258. The closure plate 258 is configured to move between an open position and a closed position such that it acts like a valve.

The closure plate 258 may be electrostatically activated. Thus, both the closure plate 258 and the dielectric plate 254 may include an internal electrode plate 260. The sheet assembly 250 may further include a sensor 262, a controller (not shown), and a voltage source (not shown). In one example, the sensor 262 is a pressure sensor. When a pressure in a basin region exceeds a predetermined basin pressure, the controller controls the voltage source to apply a voltage to the electrode plates 260 to move the closure plate 258 from the closed position to the open position. When the pressure in the basin region falls below the predetermined basin pressure, the controller controls the voltage source to stop applying the voltage to return the closure plate 258 to the closed position. The closure plate 258 may be impermeable to gas-state and liquid state dielectric coolant in the closed state. The closure plate 258 may be permeable to gas-state dielectric coolant and impermeable to liquid-state dielectric coolant in the open position. One example of a sheet assembly is described in Micromachined Silicon Microvalve, by T. Ohnstein, T. Fukiura, J. Ridley, and U. Bonne, published in IEEE Proceedings on Micro Electro Mechanical Systems, An Investigation of Microstructures, Sensors, Actuators, Machines and Robots, dated 1990, incorporated by reference herein in its entirety.

In various aspects, the present disclosure provides another cooling assembly for electronic components having one or more sub-compartments in which an electronic component may be disposed to facilitate retention of liquid-state dielectric coolant near the electronic components. With reference to FIGS. 8A-8C, a cooling assembly 310 according to various aspects of the present disclosure is provided. The cooling assembly 310 includes a housing 312 having a body 314 and an interior compartment 316. The housing 312 may be similar to the housing 12 of FIGS. 1A-1B. The cooling assembly 310 further includes a plurality of protrusions 318 (FIGS. 8A-8B), similar to the protrusions 70 of FIG. 1A.

The body 314 includes a floor 320 (FIGS. 8A-8B), a ceiling 322 (FIGS. 8A-8B), and a plurality of side walls 324. The cooling assembly 310 further includes one or more baffles 326 (e.g., four baffles 326) coupled to the body 314. More particularly, the baffles 326 may project from the floor 320 into the interior compartment 316 such that the baffles 326 extend substantially perpendicular to the floor 320. In certain aspects, the baffles 326 extend continuously between opposing side walls 324 and substantially parallel to one another. However, baffles may be provided in other arrangements.

The baffles 326 may cooperate with the body 314 to define one or more sub-compartments 330. Electronic components 332 are disposed within the sub-compartments 330. A basin region 334 of the interior compartment 316 includes a dielectric coolant 336 in its liquid state, which may be similar to the dielectric coolant 32 of FIG. 1A. In a gas state, the dielectric coolant 336 is configured to diffuse in a first or upward direction 338 into an upper region 340 to condense on the protrusions 318 (FIGS. 8A-8B). Upon condensation, the liquid-state dielectric coolant 336 is configured to form droplets and travel in a second or downward direction 342 (FIGS. 8A-8B) to return to the basin region 334.

During motion of the cooling assembly 310, such as when the cooling assembly 310 is used on a moving vehicle, the baffles 326 may reduce or prevent loss of the dielectric coolant 336 from the sub-compartments 330, as best shown in FIG. 8B. Accordingly, the baffles 326 may retain the dielectric coolant 336 around the electronic components 332 to improve cooling of the electronic components 332. The baffles 326 may ensure that the electronic components 332 are always at least partially surrounded by the liquid-state dielectric coolant 336, or optionally fully submerged in the liquid-state dielectric coolant 336. In retaining the dielectric coolant 336 in or near the basin region 334, the baffles 326 also reduce or prevent contact between the liquid-state dielectric coolant 336 and the protrusions 318. A height of the dielectric coolant 336 may be different in different portions of the basin region 334 due to possible redistribution during the phase change process. In certain aspects, the entire basin region 334 may contain the dielectric coolant 336 (rather than only the sub-compartments 330).

The baffles 326 may have a first height 344 (FIG. 8A) that is less than a second height 346 (FIG. 8A) of the interior compartment 316. The first height 344 may be optimized depending on the types of motion expected during use of the cooling assembly 310. For example, a cooling system for an electronic component of a vehicle that is expected to travel on steep grades may have relatively high baffles.

In certain aspects, a cooling assembly may include targeted cooling such that substantially all of a dielectric coolant is disposed within one or more sub-compartments. Referring to FIG. 9, another cooling assembly 360 according to various aspects of the present disclosure is provided. The cooling assembly 360 may generally include a housing 362 having a body 364 and an interior compartment 366. The cooling assembly 360 may further include a plurality of protrusions 368. Unless otherwise described, the cooling assembly 360 may be similar to the cooling assembly 310 of FIGS. 8A-8C.

The cooling assembly 360 may further include a plurality of baffles 370. The baffles 370 may cooperate with one another and the housing 362 to define one or more sub-compartments 372. Electronic components 374 are disposed within the sub-compartments 372. A dielectric coolant 376 is disposed within each sub-compartment 372. Substantially all of the dielectric coolant 376 may be disposed within the sub-compartments 372. The protrusions 368 may be disposed in discrete regions 378 over the sub-compartments 372 to facilitate return of the dielectric coolant 376 to the sub-compartments 372 upon condensation of the dielectric coolant 376.

In certain aspects, a cooling assembly may include baffles having different shapes or configurations to form sub-compartments. With reference to FIG. 10 another cooling assembly 410 according to various aspects of the present disclosure is provided. The cooling assembly 410 may generally include a housing 412 having a body 414 and an interior compartment 416. The cooling assembly 410 may further include a plurality of protrusions (see, e.g., protrusions 318 of FIGS. 8A-8B). Unless otherwise described, the cooling assembly 410 may be similar to the cooling assembly 310 of FIGS. 8A-8C.

The cooling assembly 410 may further include a plurality of baffles 420. The baffles 420 may cooperate with one another and the housing 412 to define one or more sub-compartments 422. Electronic components 424 are disposed within the sub-compartments 422. A dielectric coolant 426 may be disposed within a basin region 428 of the interior compartment 416. Rather than extending continuously between side walls 430 of the housing 412, the baffles 420 may define substantially rectangular cross sections.

In various aspects, a cooling assembly may include both baffles and a cover component to facilitate retention of a dielectric coolant around an electronic component. Referring to FIG. 11, yet another cooling assembly 450 according to various aspects of the present disclosure is provided. The cooling assembly 450 may generally include a housing 452 having a body 454 and an interior compartment 456. The cooling assembly 450 may further include a plurality of protrusions (see, e.g., protrusions 318 of FIGS. 8A-8B).

The housing 452 may include a floor 460, a ceiling (see, e.g., ceiling 322 of FIGS. 8A-8B), and a plurality of side walls 462. A platform 464 may be disposed within the interior compartment 456 and spaced apart from the floor 460 to define a gap 466 (such as by a plurality of posts extending between the floor 460 and the platform 464, not shown). A plurality of baffles 468 may project from the platform 464. The baffles 468 may cooperate with the platform 464 to define one or more sub-compartments 470. Electronics components 472 are disposed within the sub-compartments 470.

A cover component 474 extends over each sub-compartment 470. The cover components 474 may be coupled to respective baffles 468. The cover components 474 may define ports 476. A basin region 478 of the interior compartment 456 may include a dielectric coolant 480, such as the dielectric coolant 32 of FIGS. 1A-1B. The dielectric coolant 480 may flow within the gap 466 to facilitate increased heat transfer between the electronic components 472 and the dielectric coolant 480. A height of the dielectric coolant 480 may be different in different portions of the basin region 478 throughout operation of the cooling assembly 450 due to the phase change process.

In various aspects, a cooling assembly according to various aspects of the present disclosure includes an accumulator fluidly connected to a basin region to reduce or prevent the occurrence of dry-out of the basin region. Referring to FIG. 12, a cooling assembly 510 according to various aspects of the present disclosure is provided. The cooling assembly 510 may include a housing 512 having a body 514 and an interior compartment 516. The cooling assembly 510 may further include a plurality of protrusions 518, similar to the protrusions 70 of FIGS. 1A-1B.

The interior compartment 516 further includes a basin region 520 containing a dielectric coolant 522. Electronic components 524 are disposed within the basin region 520 in thermal communication with the dielectric coolant 522. In certain aspects, the electronic components 524 may be fully submerged in the dielectric coolant 522.

The basin region 520 may be fluidly connected to an accumulator 526. The accumulator 526 may provide additional liquid-state dielectric coolant 522 to the basin region 520 as the liquid-state dielectric coolant 522 in the basin region 520 changes state and diffuses in an upward direction 528 such that a constant liquid level 532 is maintained between the basin region 520 and the accumulator 526. When gas-state dielectric coolant 522 condenses and falls in a downward direction 534 to return to the basin region 520, a portion of the liquid-state dielectric coolant 522 returns to the accumulator 526 to maintain the constant liquid level 532.

By maintaining the constant liquid level 532, the accumulator 526 may reduce or prevent dry-out in the basin region 520. Accordingly, the electronic components 524 may remain in thermal contact with the liquid-state dielectric coolant 522, such as by being fully submerged. The accumulator 526 may be used alone or with other features, such as a cover component (see, e.g., cover component 40 of FIGS. 1A-1B, cover components 474 of FIG. 11) or baffles (see, e.g., baffles 326 of FIGS. 8A-8C, baffles 420 of FIG. 10).

In various aspects, a cooling assembly may further include a fan in communication with protrusions to increase a rate of cooling of the protrusions and a corresponding rate of condensation of a dielectric coolant. With reference to FIG. 13, a cooling assembly 550 according to various aspects of the present disclosure is provided. The cooling assembly 550 may generally include a housing 552 having a body 554 and an interior compartment 556. The cooling assembly 550 may further include a plurality of protrusions 558. Electronic components 560 may be in thermal contact with a dielectric coolant 562 within a basin region 564 of the interior compartment 556. The housing 552, protrusions 558, and dielectric coolant 562 may be similar to the housing 12, the protrusions 70, and the dielectric coolant 32 of FIGS. 1A-1B, respectively.

The cooling assembly 550 may further include a fan 570. The fan 570 may be disposed exterior 572 to the housing 552. The fan 570 may be operated when a temperature of the protrusions 558 exceeds a predetermined temperature value. For example, a thermistor 574 may be coupled to at least one of the protrusions 558 and configured to detect a temperature of the protrusion 558. The thermistor 574 may be in communication with a controller 576. At 578, the controller 576 may determine whether the detected temperature of the thermistor 574 exceeds a predetermined temperature value. If yes, at 580, the controller 576 operates the fan 570. If no, at 582, the controller 576 does not operate the fan 570.

The fan 570 may be used to increase the circulation of air around outer portions 584 of the protrusions 558. Accordingly, a rate of cooling may be increased when the fan 570 is operated at 580. The increased rate of cooling may facilitate an increase in rate of condensation of gas-state dielectric coolant to liquid-state dielectric coolant so that the liquid-state dielectric coolant can be returned to the basin region 564. The fan 570 can be used alone, or in combination with other features, such as a cover component (see, e.g., cover component 40 of FIGS. 1A-1B, cover components 474 of FIG. 11), baffles (see, e.g., baffles 326 of FIGS. 8A-8C, baffles 420 of FIG. 10), or an accumulator (see, e.g., accumulator 526 of FIG. 12).

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A cooling assembly comprising:
   a housing comprising a body and an interior compartment having a basin region;
   an electronic component disposed within the basin region;
   a dielectric coolant disposed within the basin region, the dielectric coolant being configured to undergo phase change between a liquid state and a gas state, the dielectric coolant being in direct contact with the electronic component when the dielectric coolant is in the liquid state; and
   a cover component extending transversely through the interior compartment and coupled to the body, the cover component being disposed in a direction with respect to the basin region, the cover component at least partially defining a port in fluid communication with the basin region, wherein the cover component is configured to permit flow therethrough of the dielectric coolant in the gas state in at least the direction, at least a portion of a perimeter of the cover component being transversely spaced apart from the body to define the port.

2. The cooling assembly of claim 1, wherein the cover component is substantially impermeable to the dielectric coolant in the liquid state.

3. The cooling assembly of claim 1, wherein the cover component is configured to direct a flow of the dielectric coolant in the liquid state to the port.

4. The cooling assembly of claim 1, further comprising a plurality of protrusions disposed in the direction with respect to the cover component, the plurality of protrusions extending (i) from the body into the interior compartment, (ii) from the body to an exterior of the housing, or (iii) into the interior compartment and to the exterior of the housing.

5. The cooling assembly of claim 4, wherein the plurality of protrusions includes a first portion extending from the body into the interior compartment and a second portion extending from the body to the exterior of the housing.

6. The cooling assembly of claim 1, further comprising a fan coupled to an exterior of the housing and configured to circulate air across the body.

7. The cooling assembly of claim 1, wherein, when substantially all of the dielectric coolant is in the liquid state, the electronic component is fully submerged in the dielectric coolant and the cover component is outside of the dielectric coolant.

8. The cooling assembly of claim 1, wherein the port has a dimension of greater than or equal to about 1 mm to less than or equal to about 2 mm.

9. The cooling assembly of claim 1, wherein the cover component comprises a plurality of apertures configured to permit flow of the dielectric coolant through the plurality of apertures in the gas state and substantially prevent flow of the dielectric coolant through the plurality of apertures in the liquid state.

10. The cooling assembly of claim 9, wherein the cover component comprises a microporous membrane or a breathable fabric.

11. The cooling assembly of claim 1, wherein the cover component comprises a plurality of valves, the plurality of valves being configured to shift between an open configuration to permit flow of the dielectric coolant and a closed configuration to prevent flow of dielectric coolant.

12. The cooling assembly of claim 1, further comprising an accumulator fluidly connected to the interior compartment, the accumulator being configured to contain a portion of the dielectric coolant in the liquid state.

13. The cooling assembly of claim 1, further comprising a baffle disposed in the interior compartment, the baffle at least partially defining a sub-compartment in which the electronic component is disposed within the basin region.

14. The cooling assembly of claim 1, wherein the dielectric coolant has a boiling point of greater than or equal to about −40° C. to less than or equal to about 200° C.

15. The cooling assembly of claim 1, wherein the direction is an upward direction.

16. A cooling assembly comprising:
   a housing comprising a body and an interior compartment having a basin region;
   a baffle disposed in the interior compartment and at least partially defining a sub-compartment;
   an electronic component disposed at least partially within the sub-compartment of the basin region;
   a dielectric coolant disposed within the basin region, the dielectric coolant being configured to undergo phase change between a liquid state and a gas state, the dielectric coolant being in direct contact with the electronic component when the dielectric coolant is in the liquid state; and
   a cover component extending transversely though the interior compartment and coupled to the baffle, the cover component being disposed in a direction with respect to the basin region, the cover component at least partially defining a port in fluid communication with the basin region, wherein the cover component is configured to permit flow therethrough of the dielectric coolant in the gas state in at least the direction.

17. The cooling assembly of claim 16, wherein, in the liquid state, substantially all of the dielectric coolant is disposed within the sub-compartment.

18. A cooling assembly comprising:
   a housing comprising a body and an interior compartment having a basin region;
   an electronic component disposed within the basin region;
   a dielectric coolant disposed within the basin region, the dielectric coolant being configured to undergo phase change between a liquid state and a gas state, the dielectric coolant being in direct contact with the electronic component when the dielectric coolant is in the liquid state; and a cover component extending transversely through the interior compartment and coupled to the body, the cover component being disposed in a direction with respect to the basin region, the cover component at least partially defining a port in fluid communication with the basin region, the cover component being configured to permit flow therethrough of the dielectric coolant in the gas state in at least the direction, and the cover component comprising one of:

(i) a plurality of apertures configured to permit flow of the dielectric coolant through the plurality of apertures in the gas state and substantially prevent flow of the dielectric coolant through the plurality of apertures in the liquid state, or (ii) a plurality of valves configured to shift between an open configuration to permit flow of the dielectric coolant and a closed configuration to prevent flow of dielectric coolant.

19. The cooling assembly of claim 18, wherein the cover component comprises (ii) the plurality of valves and each valve of the plurality of valves is configured to shift from the closed configuration to the open configuration when a pressure of the dielectric coolant in the liquid state exceeds a predetermined threshold.

20. The cooling assembly of claim 18, wherein the cover component comprises (ii) the plurality of valves and the cooling assembly further comprises a pressure sensor disposed within the basin region configured to detect a pressure and a controller, wherein the controller is configured to apply a voltage to shift the plurality of valves from the closed configuration to the open configuration when a detected pressure exceeds a predetermined pressure threshold.

* * * * *